United States Patent
Ma

(10) Patent No.: US 8,112,052 B2
(45) Date of Patent: Feb. 7, 2012

(54) AUTOMATIC GAIN CONTROL LOOP WITH HYSTERESIS SWITCHING

(75) Inventor: Ching-Wen Ma, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 79 days.

(21) Appl. No.: 12/805,127

(22) Filed: Jul. 14, 2010

(65) Prior Publication Data

US 2011/0018630 A1 Jan. 27, 2011

(30) Foreign Application Priority Data

Jul. 22, 2009 (TW) .............................. 98124697 A

(51) Int. Cl.
*H04B 1/06* (2006.01)

(52) U.S. Cl. ..................... 455/234.1; 375/345

(58) Field of Classification Search .................. 455/63.1, 455/67.11, 232.1, 234.1; 375/345, 346; 330/127, 330/200

See application file for complete search history.

(56) References Cited

U.S. PATENT DOCUMENTS 7,116,955 B2 * 10/2006 Schaffer et al. ............ 455/234.1
7,436,913 B2 * 10/2008 Kang et al. .................... 375/345

* cited by examiner

*Primary Examiner* — Quochien B Vuong
(74) *Attorney, Agent, or Firm* — Bacon & Thomas, PLLC

(57) ABSTRACT

An automatic gain control system with hysteresis switching includes an error calculator for calculating the difference between a first estimation signal and a take over point (TOP) value to produce an error signal. A hysteresis comparator compares the first estimation signal and the TOP value to produce a control signal. A first gain control loop generates a first gain control signal based on the control signal to control a gain of a first variable gain amplifier. A second gain control loop generates a second gain control signal based on the control signal to control a gain of a second variable gain amplifier. As the first estimation signal leaves a hysteresis region of the hysteresis comparator, the first gain control signal is monotonically decreasing and the first gain control signal is monotonically increasing. As a result, the total gain is stable.

20 Claims, 15 Drawing Sheets

AUTOMATIC GAIN CONTROL LOOP WITH HYSTERESIS SWITCHING

BACKGROUND OF THE INVENTION

1. Field of the Invention

The present invention relates to the technical field of automatic gain control (AGC) and, more particularly, to a double-loop automatic gain controlling system based on hysteresis switching with a stably changing total gain.

2. Description of Related Art

FIG. 1 is a block diagram of automatic gain control in the prior art. An antenna 102 receives wireless communication signals. A coordinator 100 has a band-pass filter 104 for selecting a broadband spectrum including signals. A low noise amplifier 106 magnifies the broadband spectrum signals selected by the band-pass filter 104 according to a fixed magnification. A variable gain amplifier 108 magnifies the output signals of the low noise amplifier 106 according to a control signal $V_{RF}$. A down converter 110 changes the frequency of the output signals of the variable gain amplifier 108 from the radio frequency to the intermediate frequency. A band-pass filter 112 executes narrowband filtering to filter and thus generate a narrowband signal. A variable gain amplifier 114 magnifies the output signals of the band-pass filter 112 according to a control signal $V_{IF}$. An A/D converter 116 changes the output signals of the variable gain amplifier 114 to digital type. An automatic gain control device 120 outputs signals according to the A/D converter 116 and a power monitoring device 122 to generate the control signal $V_{RF}$ of the variable gain amplifier 108 and the control signal $V_{IF}$ of the variable gain amplifier 114.

For example, in the prior art, the output voltage $V_Z$ of the variable gain amplifier 114 is 110 dB μV approximately, and its corresponding voltage is 400-500 mV approximately, which corresponds to the range of input voltage of the A/D converter 116. If the input voltage Vx of the coordinator 100 is 60 dB μV approximately, which is the strength of the RF signal, and the band-pass filter 112 has a gain loss of −20 dB, it could be calculated that the sum of the gain of the coordinator 100 and the variable gain amplifier 114 is 110−(60−20)=70 dB μV, wherein the gain of the coordinator 114 includes the gain of the low noise amplifier 106 and the gain of the variable gain amplifier 108. However, since many reasons, such as the channel noise and the channel variability, may cause the input voltage Vx of the coordinator 100 to drift around 60 dB μV, the automatic gain control device 120 should adjust the control signals $V_{RF}$ and $V_{IF}$.

FIG. 2 is a schematic diagram of operation of gain adjustment of automatic gain control in the prior art, which is divided into area I and area II according to the level of input voltage, namely, the input voltage Vx of the coordinator 100. In the area I, the control signal $V_{RF}$ is used to fix the gain of the variable gain amplifier 108 to a predetermined maximum gain GRFmax, and the control signal $V_{IF}$ is used to adjust the gain of the variable gain amplifier 114. In the area II, the control signal $V_{IF}$ is used to fix the gain of the variable gain amplifier 114 to a predetermined minimum gain GIFmin, and the control signal $V_{RF}$ is used to adjust the gain of the variable gain amplifier 108. The predetermined maximum gain GRFmax of the variable gain amplifier 108 is not the real maximum gain RFgain_max, and for performance and linear magnification, generally the predetermined maximum gain GRFmax is designed as slightly less than the maximum gain RFgain_max. For the same reason, the predetermined minimum gain GIFmin of the variable gain amplifier 114 is not the minimum gain IFgain_min, and generally the predetermined minimum gain GIFmin is designed larger than the minimum gain IFgain_min slightly.

As shown in FIG. 2, when the level of the input voltage Vx of the coordinator 100 is 60 dB μV, the variable gain amplifier 108 and the low noise amplifier 106 provide gain of 40 dB for GRFmax, and the variable gain amplifier 114 provides gain of 30 dB for GIFmin. When the level of the input voltage Vx of the coordinator 100 is 70 dB μV, the variable gain amplifier 114 provides fixed gain of 30 dB for GIFmin, and the variable gain amplifier 108 adjusts its gain according to the control voltage $V_{RF}$ outputted by the automatic gain control device 120, and the voltage $V_Z$ is 110 dB μV approximately, which is neither too large to exceed the range of input voltage of the A/D converter 116 nor too small to prevent the A/D converter 116 from proceeding conversion.

When the level of the input voltage Vx of the coordinator 100 is 50 dB μV, the variable gain amplifier 114 provides fixed gain of 40 dB for GRFmax, the variable gain amplifier 114 adjusts its gain according to the control voltage $V_{IF}$ outputted by the automatic gain control device 120, and the voltage $V_Z$ is 110 dB μV approximately.

However, when the level of the voltage Vx is approximately 60 dB μV, the whole automatic gain control system frequently switches between the area I and the area II. In the case, it not only easily generates low frequency noise due to switching, resulting in negatively affecting the gain adjustment of the automatic gain control system, but also easily makes the system instability.

Therefore, it is desirable to provide an improved automatic gain control system to mitigate and/or obviate the aforementioned problems.

SUMMARY OF THE INVENTION

The object of the present invention is to provide an automatic gain control system with hysteresis switching, which uses a hysteresis comparator to solve the problems of system instability and increasing noises generated by frequently switching, and also solve the problems of the errors caused by abruptly changed gain generated by using the hysteresis comparator.

To achieve the object, an automatic gain control system is provided, which includes an automatic gain control path and a control device. The automatic gain control path comprises a first variable gain amplifier (VGA) and a second variable gain amplifier. The first variable gain amplifier has a predetermined maximum gain control voltage, which corresponds to a predetermined maximum gain of the first variable gain amplifier. The second variable gain amplifier has a predetermined minimum gain control voltage, which corresponds to a predetermined minimum gain of the second variable gain amplifier. The control device is used to control the gain of the first variable gain amplifier and the second variable gain amplifier. The control device includes an error calculator, a hysteresis comparator, a first automatic gain control loop, and a second automatic gain control loop. The error calculator calculates the output signal and a target value of the automatic gain control path, so as to generate an error signal. The hysteresis comparator compares a first estimation signal and the take over point (TOP) value to generate a control signal. The first automatic gain control loop is connected to the error calculator, the hysteresis comparator and the first variable gain amplifier for generating a first gain control signal according to the error signal and the control signal, to control gain of the first variable gain amplifier. The second automatic gain control loop is also connected to the error calculator, the hysteresis comparator and the second variable gain amplifier, generates a second gain control signal according to the error signal and the control signal, so as to control gain of the second variable gain amplifier. When the first estimation signal leaves the hysteresis area of the hysteresis comparator, the first gain control signal and the second gain control signal are increasing or decreasing progressively.

DETAILED DESCRIPTION OF THE PREFERRED EMBODIMENT

Figure 1:
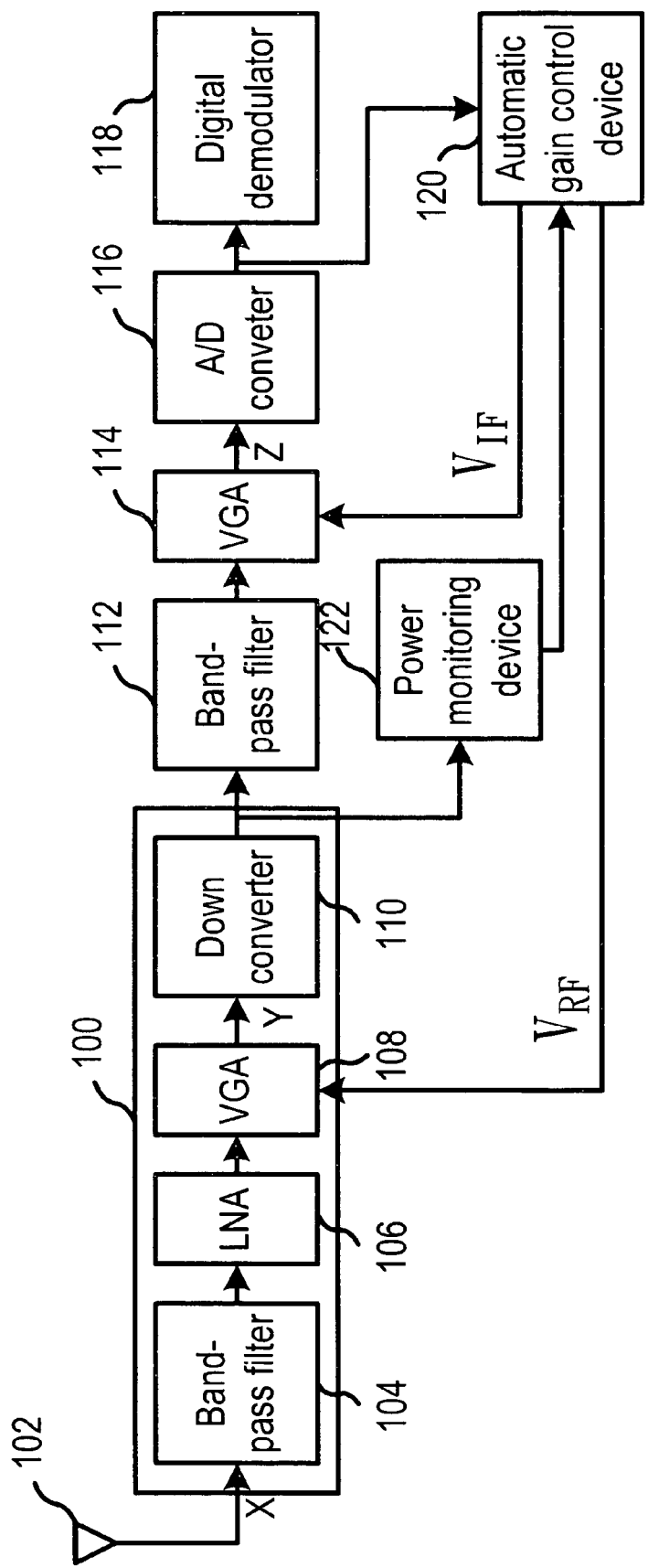
FIG. 1 is a block diagram of automatic gain control in the prior art.
Figure 2:
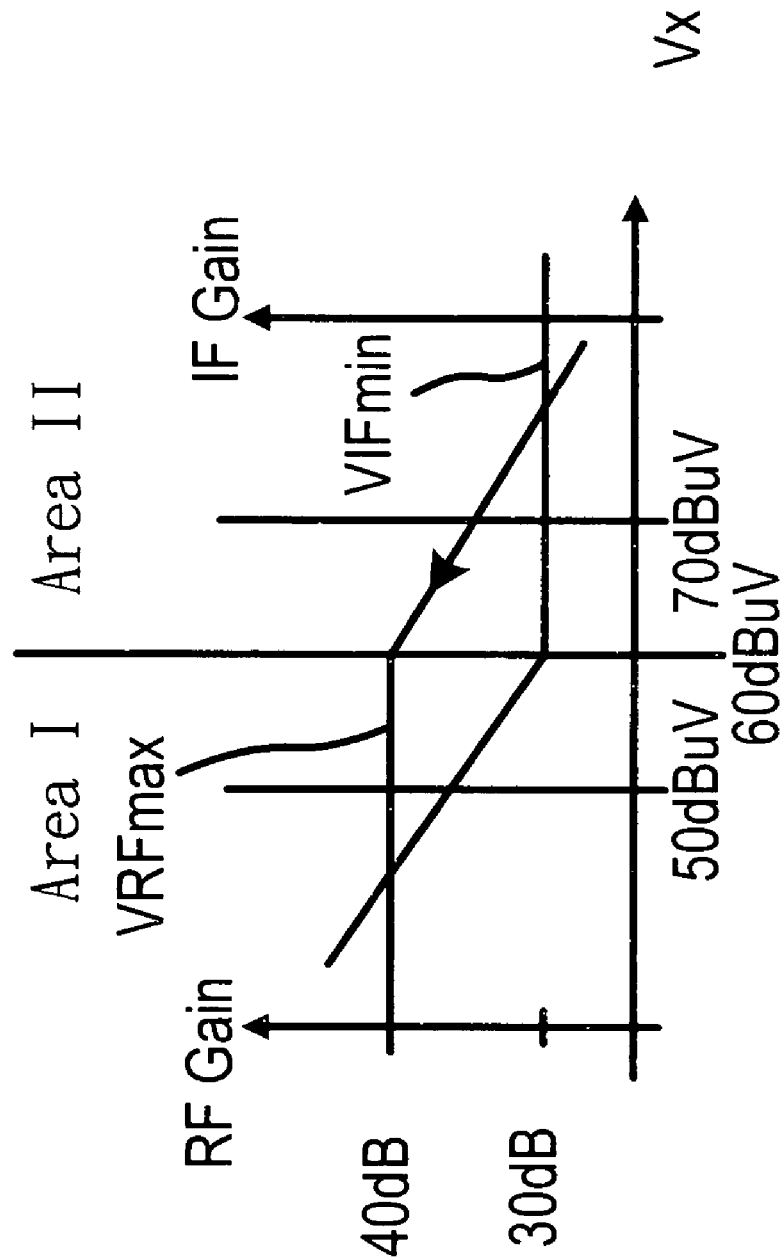
FIG. 2 is a schematic diagram of operation of gain adjustment of automatic gain control in the prior art.
Figure 3:
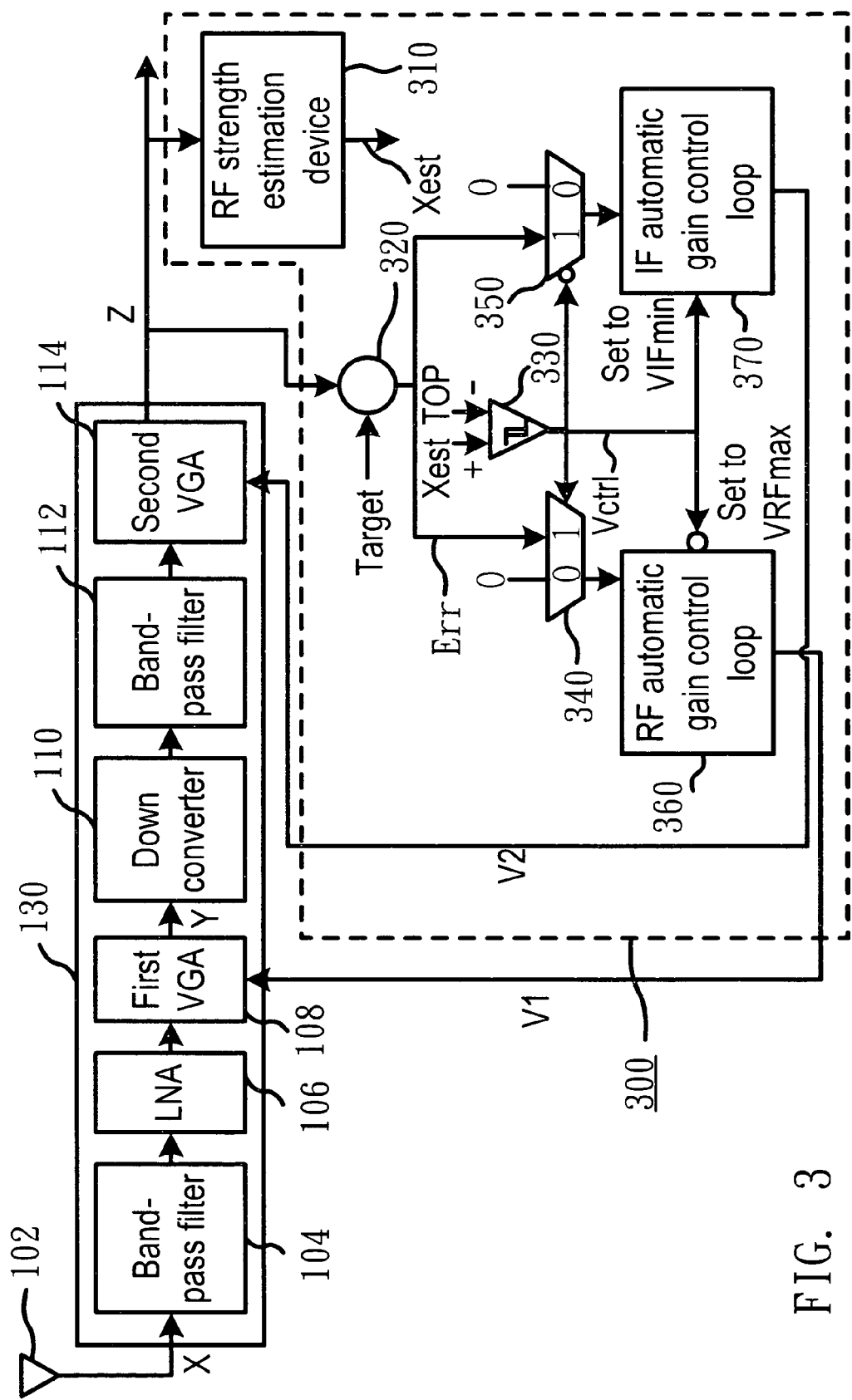
FIG. 3 is a block diagram of an automatic gain control system according to the present invention.
Figure 8:
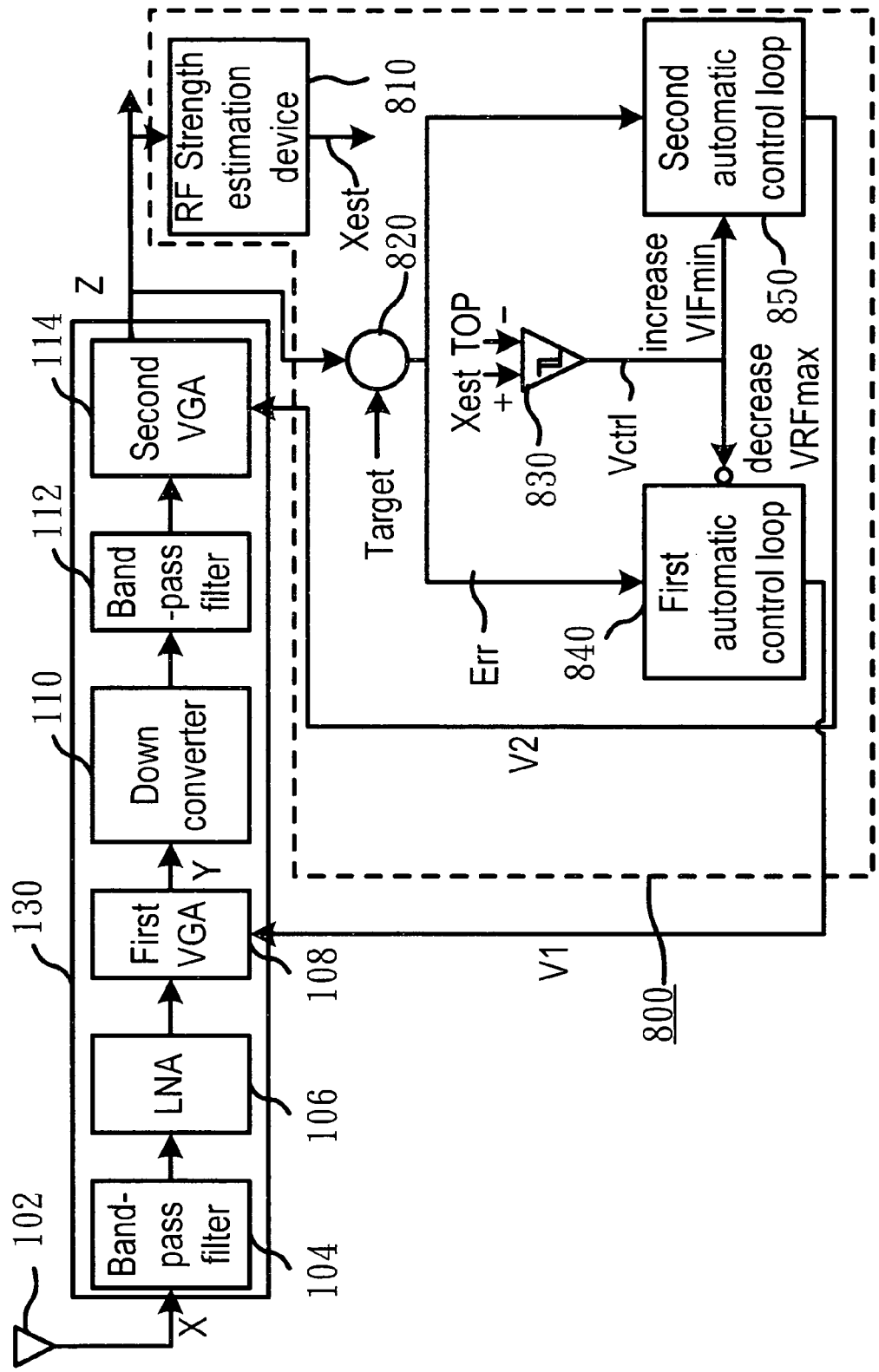
FIG. 8 is a block diagram of an automatic gain control system according to another embodiment of the invention.

For the problem that the whole automatic gain control system frequently switches between the area I and the area II when the level of the voltage Vx is around 60 dB μV, the present invention provides an automatic gain control system using a hysteresis comparator to solve the problem of system instability and increasing noises generated by frequently switching. FIG. 3 and FIG. 8 are block diagrams of two kinds of automatic gain control systems according to the present invention. The automatic gain control system shown in FIG. 3 comprises an automatic gain control path 130 and a control device 300. The automatic gain control path 130 includes a first variable gain amplifier 108 and a second automatic gain amplifier 114. The first variable gain amplifier 108 has a predetermined maximum gain control voltage VRFmax, which corresponds to a predetermined maximum gain GRFmax of the first variable gain amplifier. The second variable gain amplifier 114 has a predetermined minimum gain control voltage VIFmin, which corresponds to a predetermined minimum gain GIFmin of the second variable gain amplifier. The control device 300 is used to control the gain of the first variable gain amplifier 108 and the second variable gain amplifier 114, and the control device includes an error calculator 320, a hysteresis comparator 330, two multiplexers 340, 350, an RF automatic gain control loop 360, an IF automatic gain control loop 370, and an RF strength estimation device 310.

The RF strength estimation device 310 is connected to the automatic gain control path 130 for estimating and generating a first estimation signal Xest according the output signal Vz of the automatic gain control path 130. Since the control device 300 has the control voltages V1, V2 of the first variable gain amplifier 108 and the second variable gain amplifier 114. Before designing, it is also known that the band-pass filter has a gain loss of −20 dB. The RF strength estimation device 310 estimates the input voltage Vx of the automatic gain control path 130 to generate a first estimation signal Xest according to the output voltage Vz of the second variable gain amplifier 114.

The error calculator 320 is connected to the automatic gain control path 130 to calculate the output signal Vz of the automatic gain control path 130 and a target value, so as to generate a error signal Err. Generally, the target value is set as 110 dB μV.

The hysteresis comparator 330 compares the first estimation signal Xest and a take over point (TOP) value, so as to generate a control signal Vctrl. In the embodiment, the TOP value is 60 dB μV.

The multiplexers 340, 350 are connected to the error calculator 320 and the hysteresis comparator 330. When the control signal Vctrl is high potential, the multiplexer 340 chooses the error signal Err to output, and the multiplexer 350 chooses 0 to output. When the control signal Vctrl is low potential, the multiplexer 340 chooses 0 to output, and the multiplexer 350 chooses the error signal Err to output.

The RF automatic gain control loop 360 is connected the hysteresis comparator 330, the multiplexer 340 and the first variable gain amplifier 108 for generating a first gain control signal V1 to control the gain of the first variable gain amplifier 108 according to the control signal Vctrl.

Figure 4:
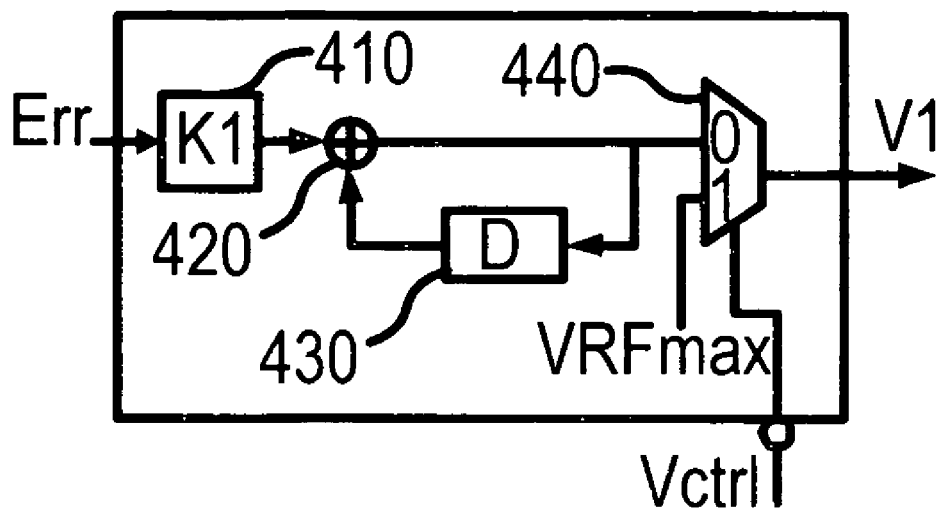
FIG. 4 is a block diagram of the RF automatic gain control loop according to the present invention.

FIG. 4 is a block diagram of the RF automatic gain control loop of FIG. 3. The RF automatic gain control loop 360 includes a multiplier 410, an adder 420, a register 430 and a multiplexer 440.

The IF automatic gain control loop 370 is connected to the hysteresis comparator 330, the multiplexer 350 and the second variable gain amplifier 114 for generating a second gain control signal V2 to control the gain of the second variable gain amplifier 114 according to the control signal Vctrl.

Figure 5:
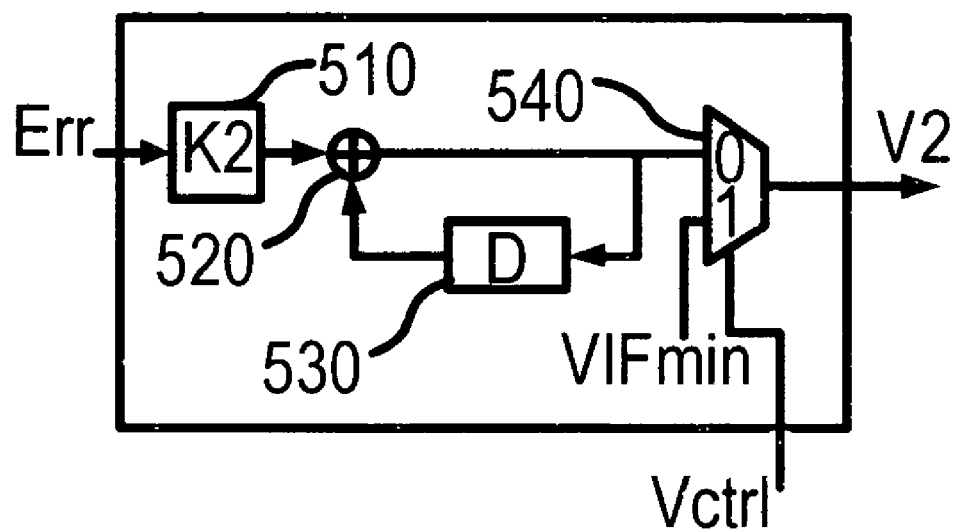
FIG. 5 is a block diagram of the IF automatic gain control loop according to the present invention.

FIG. 5 is a block diagram of the IF automatic gain control loop of FIG. 3. The IF automatic gain control loop 370 includes a multiplier 510, an adder 520, a register 530 and a multiplexer 540.

When the control signal Vctrl is high potential, the second gain control signal V2 of the IF automatic gain control loop 370 is set, and the gain of the IF variable gain amplifier 114 is the predetermined minimum gain GIFmin. Meanwhile, the second gain control signal V2 is the predetermined minimum gain control voltage VIFmin, and the first gain control voltage V1 of the RF automatic gain control loop 360 is:

$$V1(n+1)=V1(n)+K1\times\text{Err}(n),$$

where V1 is the first gain control signal, K1 is the multiplicator of the multiplier 410, and Err is the error signal. Further, n is an abbreviation of nT and n+1 is an abbreviation of (n+1)T, which represent a present time point and the next time point, respectively. Such abbreviation is an usual representation way in the control system or signal processing and thus is not described in details.

When the control signal Vctrl is low potential, the first gain control signal V1 of the RF automatic gain control loop 360 is set to make the gain of the RF variable gain amplifier 108 as the predetermined maximum gain GRFmax. Meanwhile, the first gain control signal V1 is the predetermined maximum gain control voltage VRFmax, and the second gain control signal V2 of the IF variable gain amplifier 114 is:

$$V2(n+1)=V2(n)+K2\times\text{Err}(n),$$

where V2 is the second gain control signal, K2 is the multiplicator of the multiplier 210, and Err is the error signal.

Figure 6:
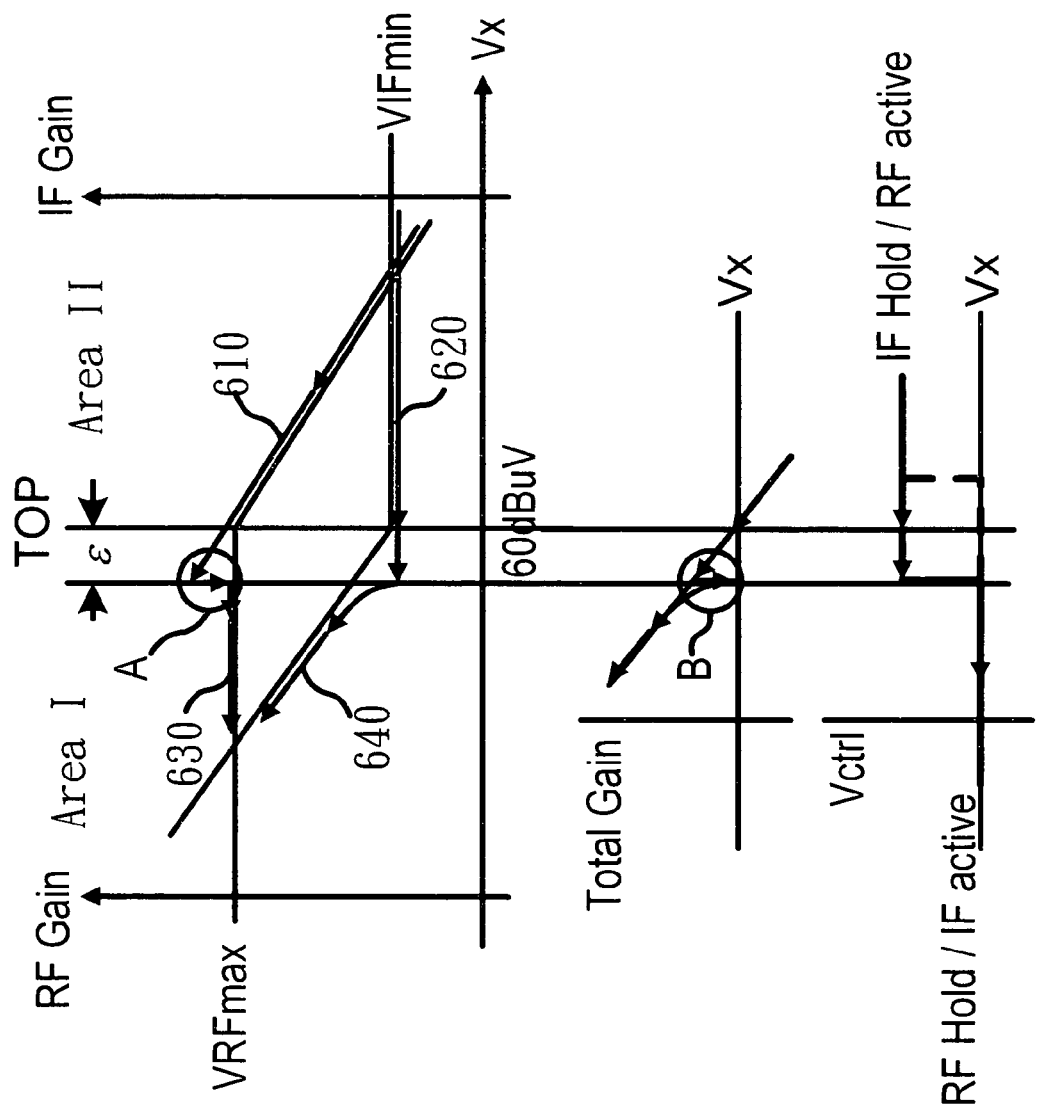
FIG. 6 and FIG. 7 are schematic diagrams of operation of automatic gain control loop with hysteresis according to the present invention.
Figure 7:
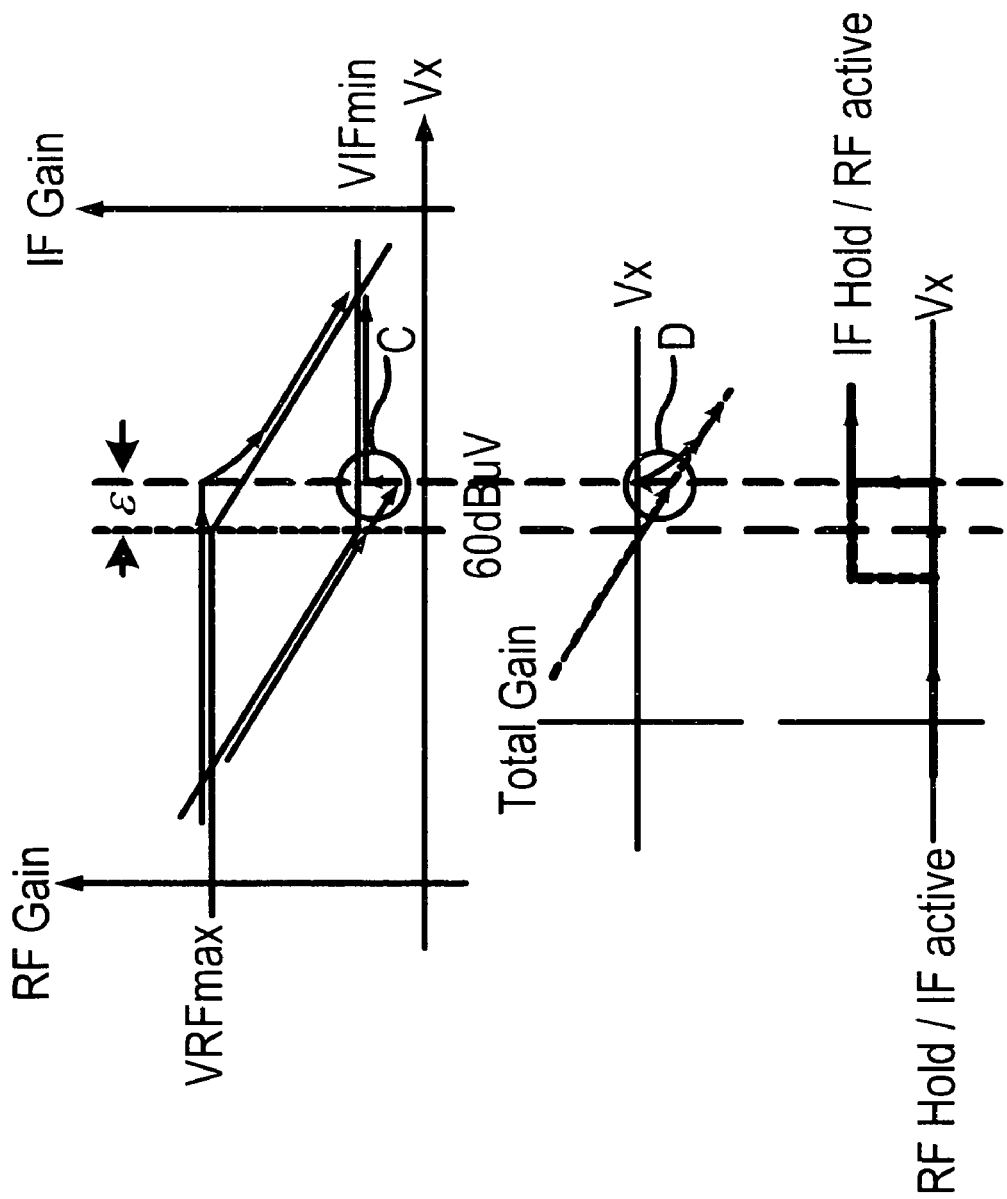

FIG. 6 and FIG. 7 are schematic diagrams of operation of automatic gain control loop with hysteresis of FIG. 3. FIG. 6 is the automatic gain control when the voltage Vx decreases gradually from larger than 60 dB μV to smaller than 60 dB μV.

As shown in FIG. 6, when the voltage Vx is larger than 60 dB μV, and the corresponding first estimation signal Xset is also larger than 60 dB μV, the control signal Vctrl is high potential, the second gain control voltage V2 of the IF automatic gain control loop 370 is set to make the gain of the second variable gain amplifier 114 be the predetermined minimum gain GIFmin, and the first gain control signal V1 of the RF automatic gain control loop 360 is V1(n+1)=V1(n)+K1×Err(n). Namely, the gain of the RF automatic gain control loop 360 moves along the line 610, and the gain of the IF variable gain amplifier 114 moves along the line 620.

When the first estimation Xest is smaller than 60 dB μV and over a hysteresis range ϵ, the control signal Vctrl is low potential, the first gain control voltage V1 of the RF automatic gain control loop 360 is set to make the gain of the RF variable gain amplifier 108 be the predetermined maximum gain GRFmax, and the second gain control signal V2 of the IF variable gain amplifier 114 is V2(n+1)=V2(n)+K2×Err(n). Namely, the gain of the RF automatic gain control loop 360 moves along the line 630, and the gain of the IF variable gain amplifier 114 moves along the line 640.

FIG. 7 is the automatic gain control when the voltage Vx increases gradually from smaller than 60 dB μV to larger than 60 dB μV. The operation of FIG. 7 is similar to that of FIG. 6, and thus a detailed description is deemed unnecessary.

The predetermined maximum gain GRFmax of the variable gain amplifier 108 is not its real maximum gain RFgain_max. For the performance and linear magnification, generally the predetermined maximum gain GRFmax is set as slightly less than the maximum gain RFgain_max. For the same reason, the predetermined minimum gain GIFmin of the variable gain amplifier 114 is not its real minimum gain IFgain_min, and generally the predetermined minimum gain GIFmin is set as slightly larger than the minimum gain IFgain_min.

By using the hysteresis comparator 330, the present invention can avoid the problem of easily producing noises due to the frequently switching between the area I and the area II of the automatic gain control system in the prior art.

Please refer to FIG. 6, when the control signal Vctrl becomes low potential from high potential, as shown in the circle A of FIG. 6, the RF automatic gain control loop 360 suddenly decreases to the predetermined maximum gain GRFmax. As shown in the circle B of FIG. 6, the total gain of the RF automatic gain control loop 360 and the IF automatic gain control loop 370 also generates a downward convex wave, which affects the operation of a backend stage, such as the A/D converter 118, resulting in generation of errors. For the same reason, in the circle C of FIG. 7, the IF automatic gain control loop 370 suddenly increases to the predetermined minimum gain GIFmin. As shown in the circle D of FIG. 7, the total gain of the RF automatic gain control loop 360 and the IF automatic gain control loop 370 also generates a upward convex wave.

For the aforementioned problems, the present invention provides an automatic gain control system. FIG. 8 is a block diagram of an automatic gain control system according to another embodiment of the invention, which comprises an automatic gain control path 130 and a control device 800.

The automatic gain control path 130 includes a first variable gain amplifier 108 and a second variable gain amplifier 114. The first variable gain amplifier 108 has a predetermined maximum gain control voltage VRFmax, which corresponds to a predetermined maximum gain GRFmax of the first variable gain amplifier 108. The second variable gain amplifier 114 has a predetermined minimum gain control voltage VIFmin, which corresponds to a predetermined minimum gain GIFmin of the second variable gain amplifier 114.

The control device 800 is used to control the first variable gain amplifier 108 and the second variable gain amplifier 114. The control device 800 includes an RF strength estimation device 810, an error calculator 820, a hysteresis comparator 830, a first automatic gain control loop 840, and a second automatic gain control loop 850.

The RF strength estimation device 810 is connected to the automatic gain control path 130 for estimating and generating a first estimation signal Xest according the output signal Vz of the automatic gain control path 130. Since the control device 800 has the control voltages V1, V2 of the first variable gain amplifier 108 and the second variable gain amplifier 114. Before designing, it is also known that the band-pass filter 112 has a gain loss of −20 dB. The RF strength estimation device 810 estimates the input voltage Vx of the automatic gain control path 130 to generate a first estimation signal Xest according to the output voltage Vz of the second variable gain amplifier 114.

The error calculator 820 is connected to the automatic gain control path 130 to calculate the output signal Vz of the automatic gain control path 130 and a target value, so as to generate an error signal Err. Generally, the target value is set as 110 dB μV.

The first automatic gain control loop 840 is connected to the hysteresis comparator 830, the error calculator 820 and the first variable gain amplifier 108 for generating a first gain control signal V1 according to the control signal Vctrl to control the gain of the first variable gain amplifier 108.

The second automatic gain control loop 850 is connected to the hysteresis comparator 830, the error calculator 820, and the second variable gain amplifier 114 for generating a second gain control signal V2 according to the control signal Vctrl so as to control the gain of the second variable gain amplifier 114.

When the first estimation signal Xest is located in the hysteresis area of the hysteresis comparator 830, the first gain control signal V1 and the second gain control signal V2 are increasing or decreasing progressively to alleviate the problem of convex waves in the above embodiment.

Figure 9:
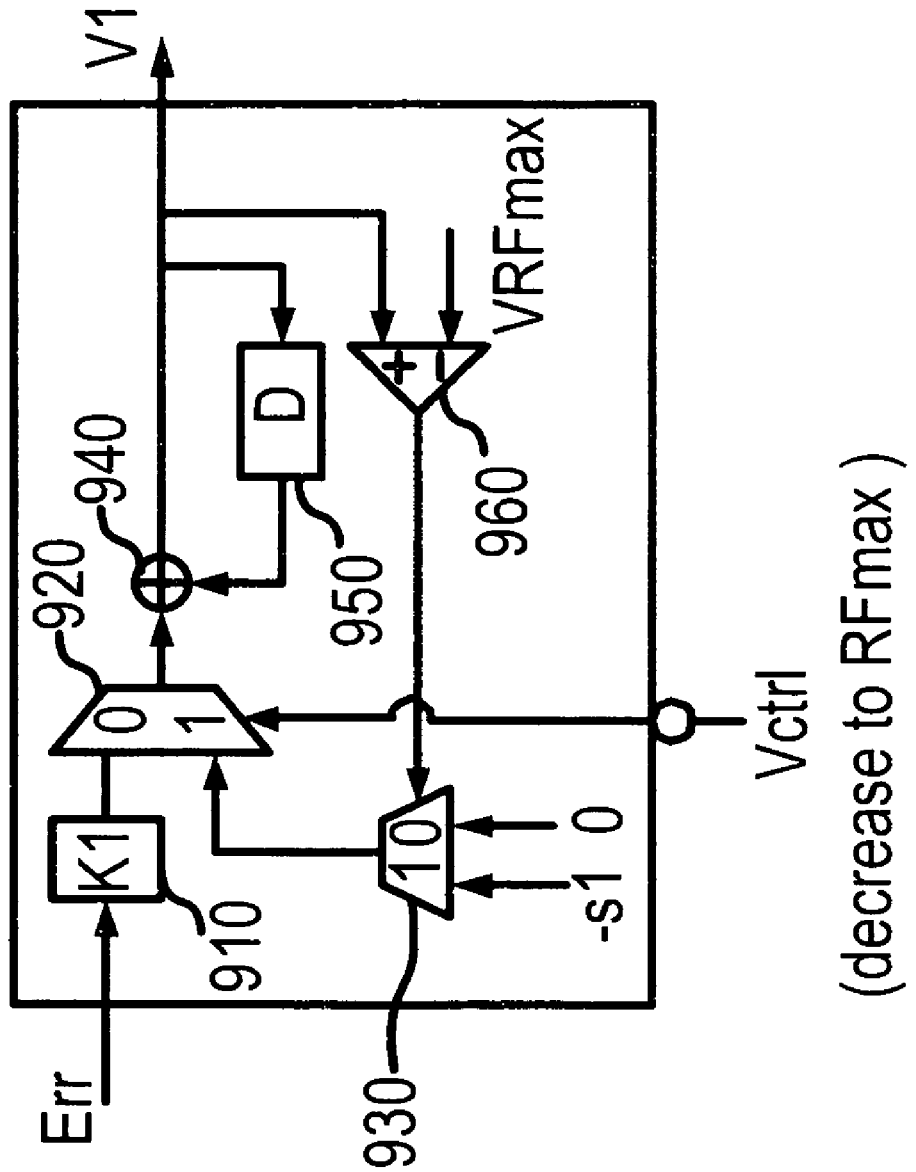
FIG. 9 is a block diagram of the first automatic gain control loop according to the present invention.

FIG. 9 is a block diagram of the first automatic gain control loop 840 according to the present invention. The first automatic gain control loop 840 includes a first multiplier 910, a first multiplexer 920, a second multiplexer 930, a first adder 940, a first register 950 and a first comparator 960.

Figure 10:
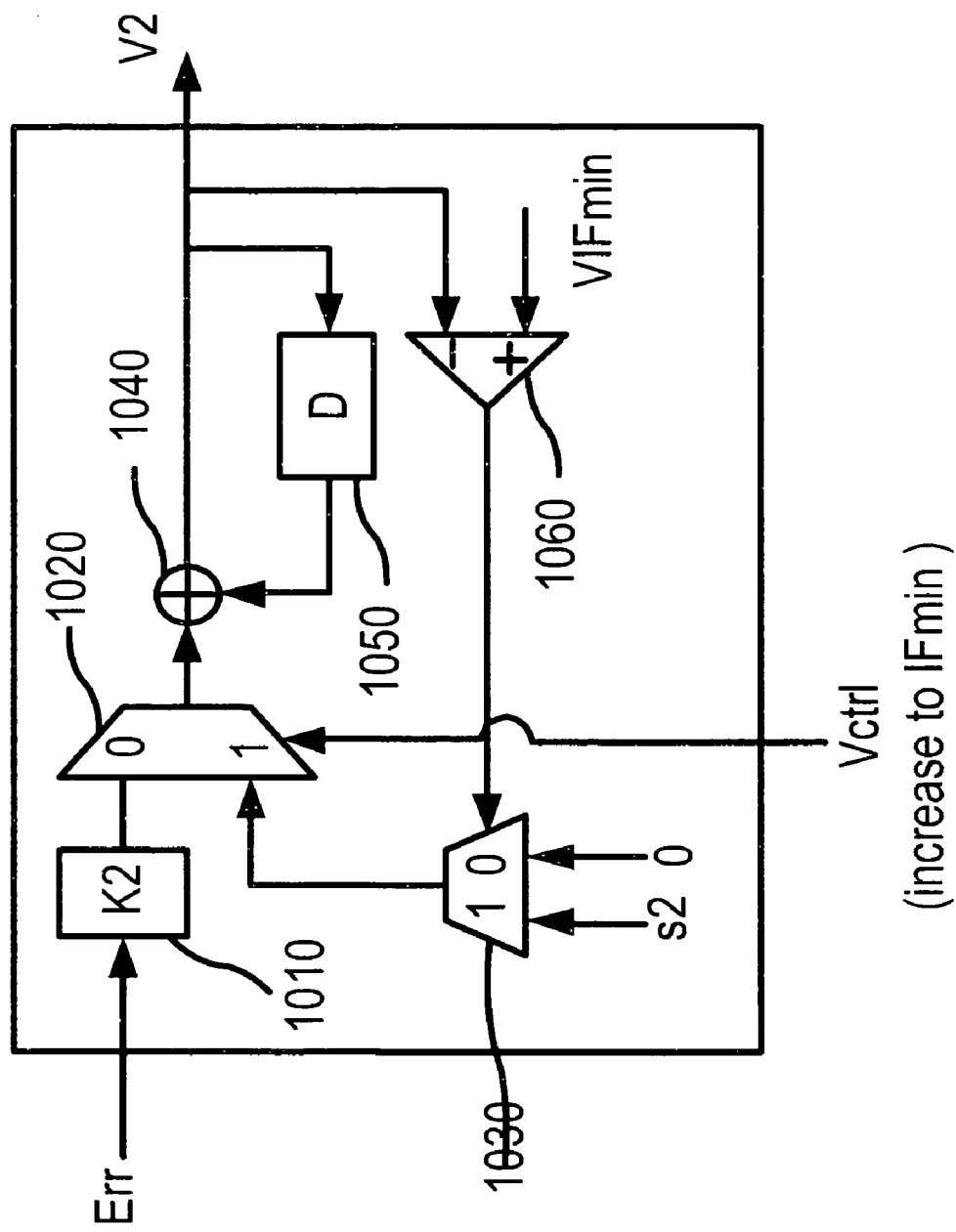
FIG. 10 is a block diagram of the second automatic gain control loop according to the present invention.

FIG. 10 is a block diagram of the second automatic gain control loop 850 according to the present invention. The second automatic gain control loop 850 includes a second multiplier 1010, a third multiplexer 1020, a fourth multiplexer 1030, a second adder 1040, a second register 1050 and a second comparator 1060.

Figure 11:
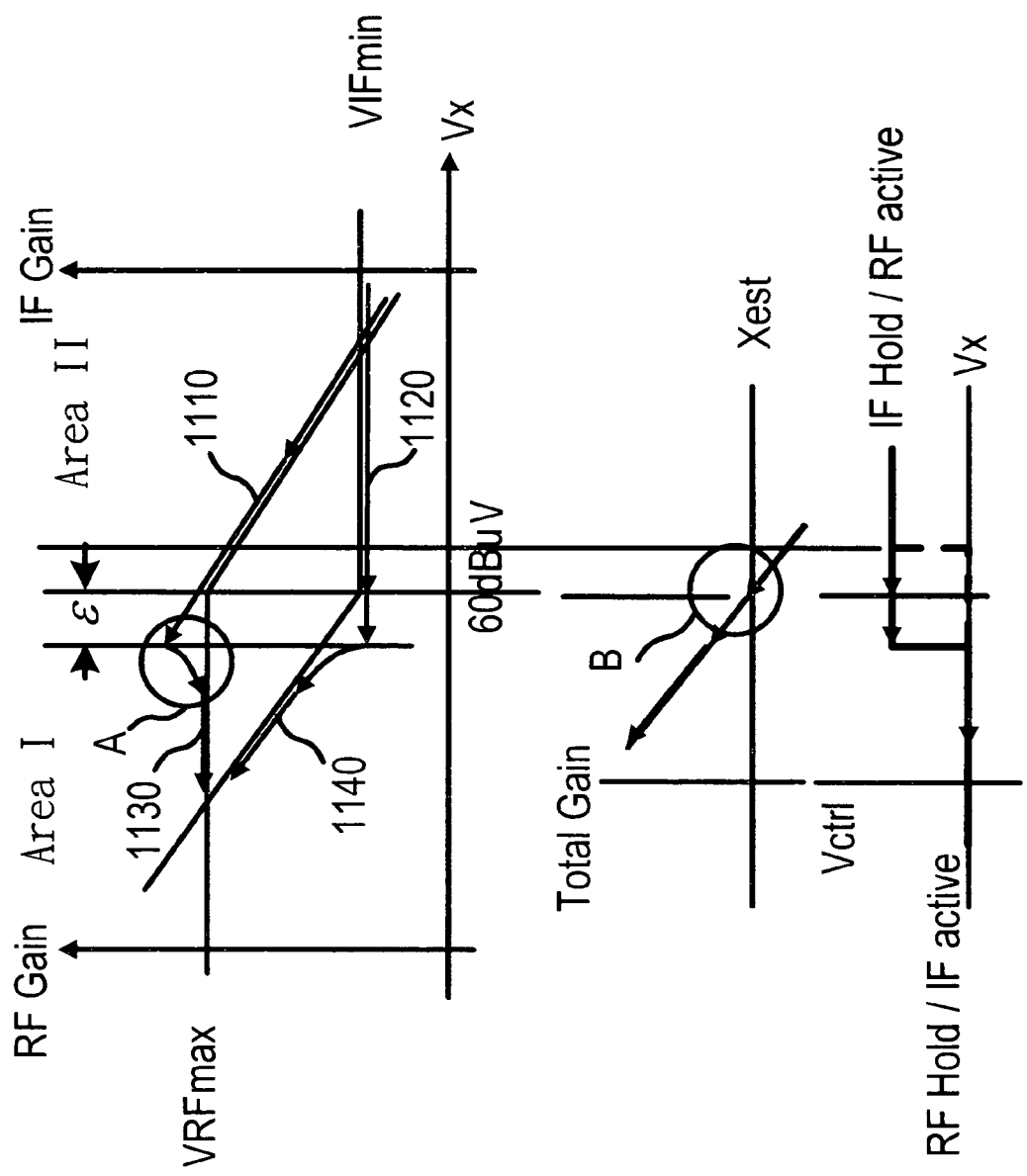
FIG. 11 and FIG. 12 are schematic diagrams of operation of the automatic gain control loop with hysteresis according to another embodiment of the invention.
Figure 12:
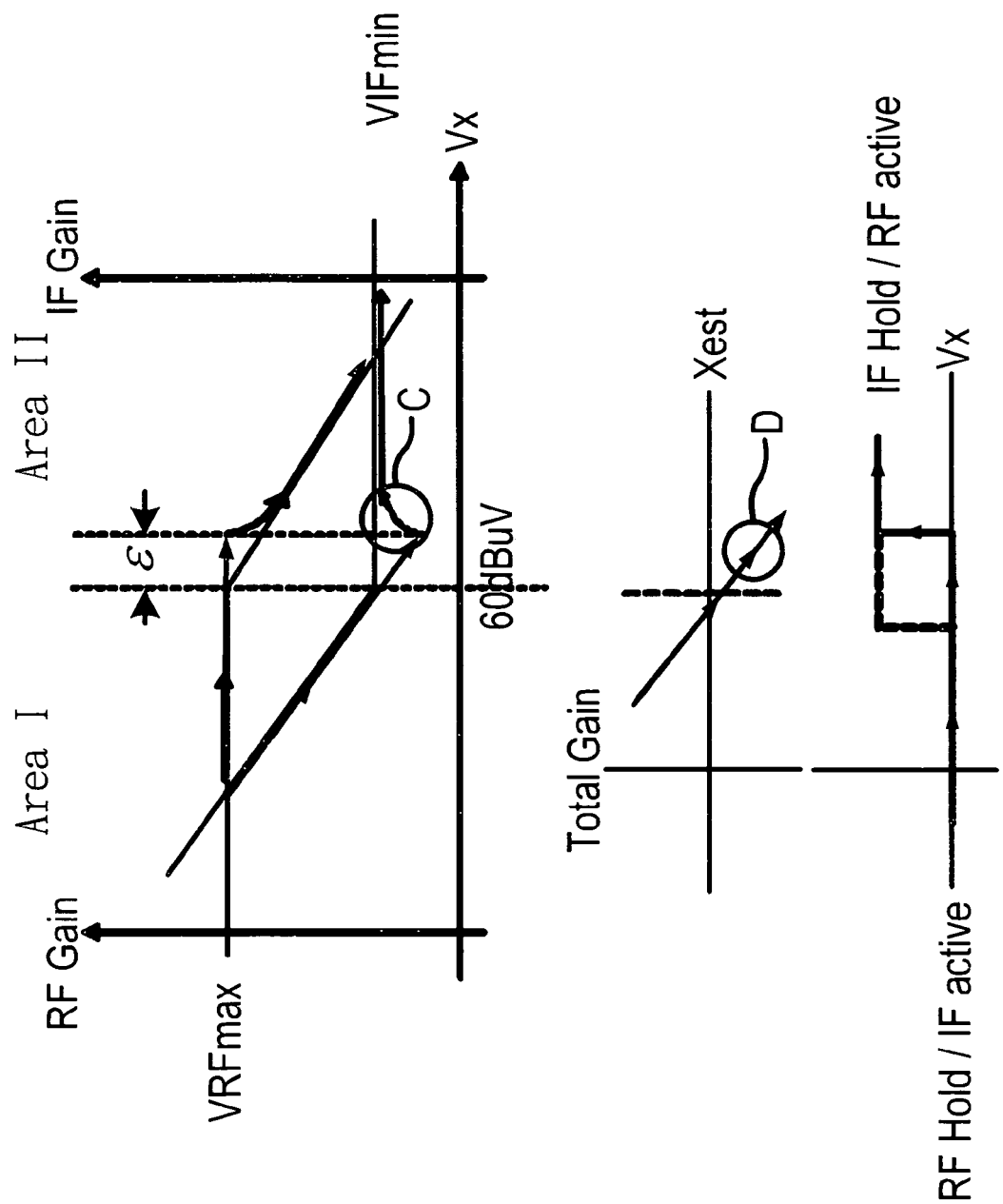

FIG. 11 and FIG. 12 are schematic diagrams of operation of the automatic gain control loop with hysteresis according to another embodiment of the invention. From FIG. 9 and FIG. 10, it is known that, when the system is located in the area II, the control voltage Vctrl is high potential, and the first gain control signal V1 corresponds to the following equation:

$$V1(n+1)=V1(n)\times \text{Err}(n)\times K1,$$

where V1 is the first gain control signal, Err is the error signal, and K1 is the multiplicator of the first multiplier 910.

Figure 14:
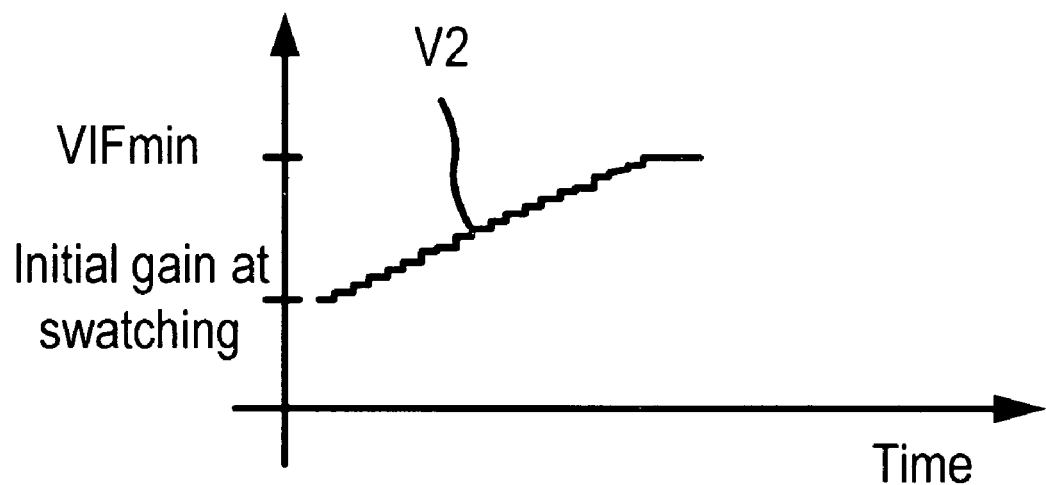
FIG. 14 is a schematic diagram of operation of the second automatic gain control loop according to the present invention.

When the control signal Vctrl is high potential and the second gain control signal V2 is smaller than the predetermined minimum gain control voltage VIFmin, the second gain control signal V2 corresponds to the following equation:

$$V2(n+1)=V2(n)+s2,$$

where V2 is the second gain control signal, and s2 is the second adjustment step. When the control signal Vctrl is high potential and the second gain control signal V2 is not smaller than the predetermined minimum gain control voltage VIFmin, the second gain control signal V2 corresponds to the following equation:

$$V2(n+1)=VIF\text{min},$$

where VIFmin is the predetermined minimum gain control voltage. Namely, as shown in FIG. 14, the second gain control signal V2 gradually increases to the predetermined minimum gain control voltage VIFmin according to the equation $V2(n+1)=V2(n)+s2$. When the second gain control signal V2 is slightly larger than the predetermined minimum gain control voltage VIFmin, the second gain control signal V2 is equal to the predetermined minimum gain control voltage VIFmin according to the equation $V2(n+1)=VIF\text{min}$.

From the above description and FIG. 11, it is known that the gain of first automatic gain control loop 840 moves along the line 1110, and the gain of the second variable gain amplifier 850 moves along the line 1120.

When the first estimation Xest is smaller than 60 dB μV and over a hysteresis range ε, the control signal Vctrl is low potential, and since the first gain control voltage V1 corresponds to the equation $V1(n+1)=V1(n)+\text{Err}(n)\times K2$, the first gain control signal V1 is larger than the predetermined maximum gain control voltage VRFmax.

When the control signal Vctrl is low potential and the first gain control signal V1 is larger than the predetermined maximum gain control voltage VRFmax, the first gain control signal corresponds to the following equation:

$$V1(n+1)=V1(n)+(-s1),$$

where V1 is the first gain control signal, and s1 is a first adjustment step.

When the control signal Vctrl is low potential and the first gain control signal V1 is not larger than the predetermined maximum gain control voltage VRFmax, the first gain control signal V1 corresponds to the following equation:

$$V1(n+1)=VRF\text{max},$$

where VRFmax is the predetermined maximum gain control voltage.

Figure 13:
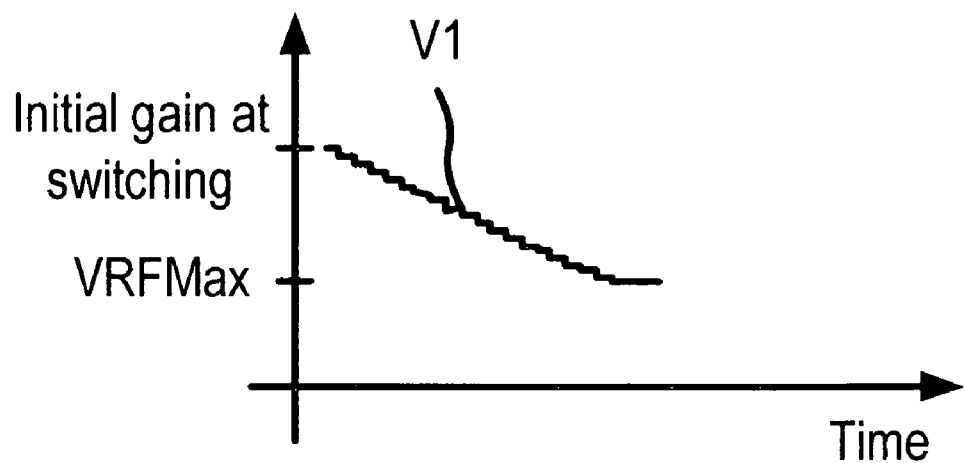
FIG. 13 is a schematic diagram of operation of the first automatic gain control loop according to the present invention.

Namely, as shown in FIG. 13, the first gain control signal V1 gradually decreases to the predetermined maximum gain control voltage VRFmax according to the equation $V1(n+1)=V1(n)+(-s1)$.

When the first gain control signal V1 is slightly smaller than the predetermined maximum gain control voltage VRFmax, the first gain control signal V1 is equal to the predetermined maximum gain control voltage VRFmax according to the equation $V1(n+1)=VRF\text{max}$.

From the above description and FIG. 11, it is known that the gain of the first automatic gain control loop 840 moves along the line 1130, and the gain of the second variable gain amplifier 850 moves along the line 1140.

When the control signal Vctrl is low potential, the second gain control signal V2 corresponds to the following equation:

$$V2(n+1)=V2(n)+\text{Err}\times K2,$$

where V2 is the second gain control signal, Err is the error signal, and K2 is the multiplicator of the second multiplier.

As shown in the circle A of FIG. 11, the first automatic gain control loop 840 does not suddenly decrease to the predetermined maximum gain GRFmax, but as shown in FIG. 12, the first gain control signal V1 gradually decreases to the predetermined maximum gain control voltage VRFmax. Meanwhile, the total gain of the first automatic gain control loop 840 and the second automatic gain control loop 850, as shown by the circle B of FIG. 11, does not generate a downward convex wave.

For the same reason, when the system is located in the area I and moves to the area II, as shown in the circle C of FIG. 12, the second automatic gain control loop 850 does not increase to the predetermined minimum gain control voltage VIFmin, and as shown in FIG. 14, the second gain control signal V2 gradually increases to the predetermined gain control voltage VIFmin. Meanwhile, the total gain of the first automatic gain control loop 840 and the second automatic gain control loop 850, as shown by the circle D of FIG. 12, does not generate an upward convex wave.

Figure 15:
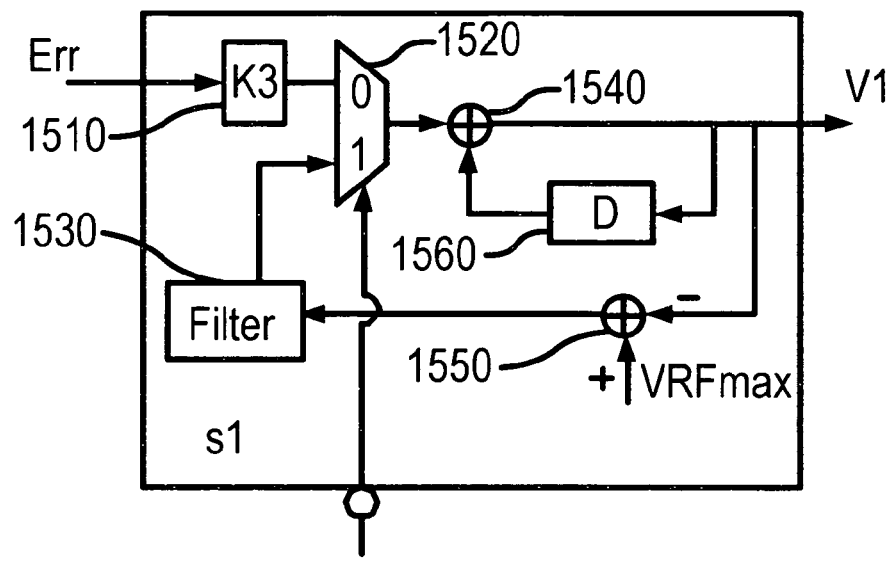
FIG. 15 is a block diagram of the first automatic gain control loop according to a further embodiment of the invention.

FIG. 15 is a block diagram of the first automatic gain control loop 840 according a further embodiment of the invention.

The first automatic gain control loop 840 includes a third multiplier 1510, a fifth multiplexer 1520, a first filter 1530, a third adder 1540, a first subtractor 1550, and a third register 1560.

Figure 16:
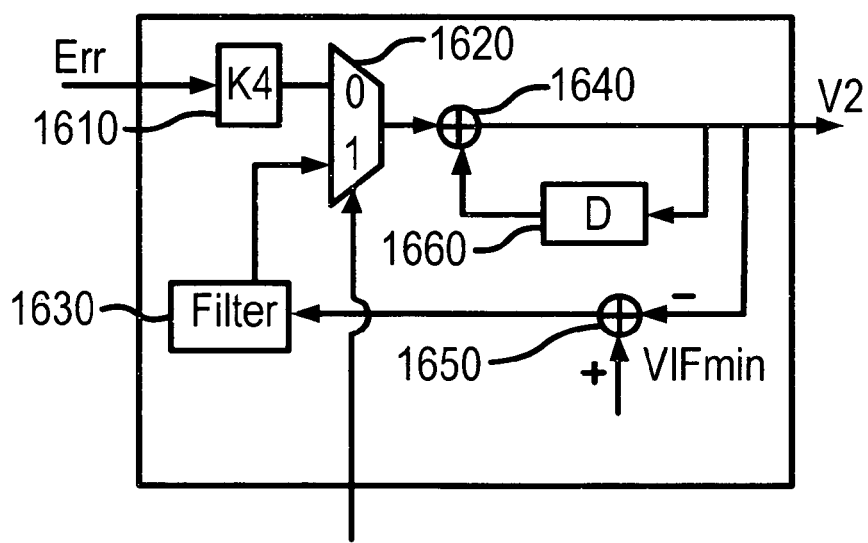
FIG. 16 is a block diagram of the second automatic gain control loop according to a further embodiment of the invention.

FIG. 16 is a block diagram of the second automatic gain control loop according to a further embodiment of the invention. The second automatic gain control loop 850 includes a fourth multiplier 1610, a sixth multiplexer 1620, a second filter 1630, a fourth adder 1640, a second subtractor 1650, and a fourth register 1660.

The first filter 1530 and the second filter 1630 are preferably low-pass filters.

When the control signal is high potential, the first gain control signal V1 corresponds to the following equation:

$$V1(n+1)=V1(n)+\text{Err}\times K3,$$

where V1 is the first gain control signal, Err is the error signal, and K3 is the multiplicator of the third multiplier. The second gain control signal corresponds to the following equation:

$$V2(n+1)=V2(n)+\text{Filter2}(VIF\text{min}-V2(n)),$$

where V2 is the second gain control signal, VIFmin is the predetermined minimum gain control voltage, Filter2(VIFmin−V2($n$)) is the output signal (VIFmin−V2($n$)) of the second filter after executing filtering to the second subtractor. Namely, in the circle C of FIG. 12, since the second gain control signal V2 is smaller than the predetermined minimum gain control voltage VIFmin, the value of Filter2((VIFmin−V2($n$)) is positive, and the second gain control signal V2 gradually increases to the predetermined minimum gain control voltage VIFmin.

When the control signal Vctrl is low potential, the first gain control signal V1 corresponds to the following equation:

$$V1(n+1)=V1(n)+\text{Filter1}(VIF\text{max}-V1(n)),$$

where V1 is the first gain control signal, VRFmax is the predetermined maximum gain control voltage, Filter1(VRFmax−V1($n$)) is the output signal (VRFmax−V1($n$)) of the first filter after executing filtering to the first subtractor. Namely, in the circle A of FIG. 11, since the first gain control signal V1 is larger than the predetermined maximum gain control voltage VRFmax, the value of Filter1(VIFmax−V1($n$)) is negative, and the first gain control signal V1 gradually decreases to the predetermined gain control voltage VRFmax. The second gain control signal V2 corresponds to the following equation:

$$V2(n+1)=V2(n)+\text{Err}\times K4,$$

where V2 is the second gain control signal, Err is the error signal, and K4 is the multiplicator of the fourth multiplier.

Figure 17:
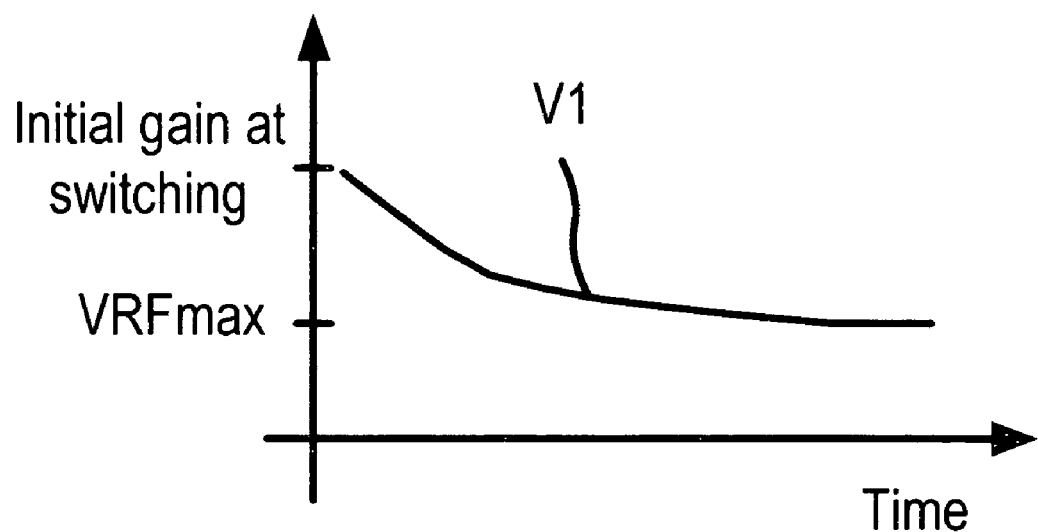
FIG. 17 is a schematic diagram of operation of the first automatic gain control loop according to a further embodiment of the invention.
Figure 18:
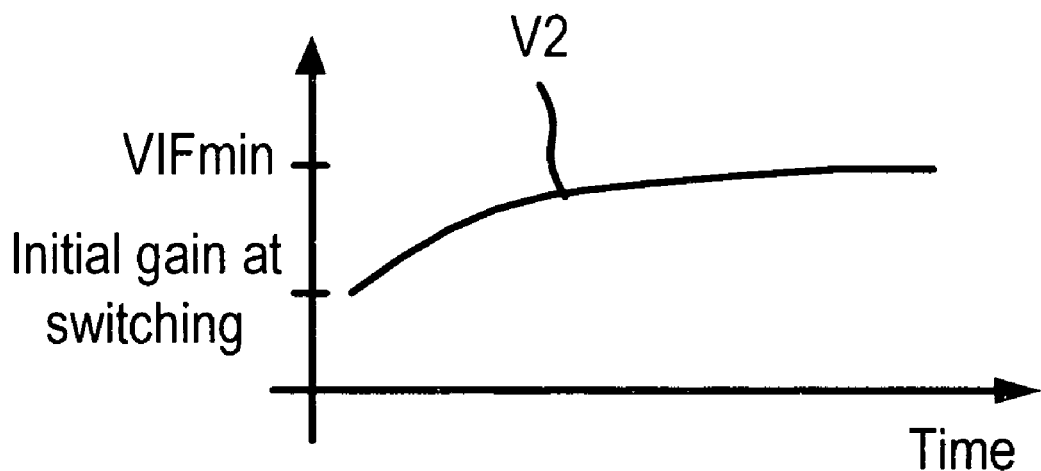
FIG. 18 is a schematic diagram of operation of the second automatic gain control loop according to a further embodiment of the invention.

As shown in FIG. 17, with the use of the first filter 1530, the first gain control signal V1 gradually decreases to the predetermined maximum gain control voltage VRFmax according to the equation V1($n$+1)=V1($n$)+Filter1(VIFmax−V1($n$)). Meanwhile, as shown in FIG. 18, with the use of the second filter 1630, the second gain control signal V2 gradually decreases to the predetermined minimum gain control voltage VIFmin according to the equation V2($n$+1)=V2($n$)+Filter2(VIFmin−V2($n$)).

Figure 19:
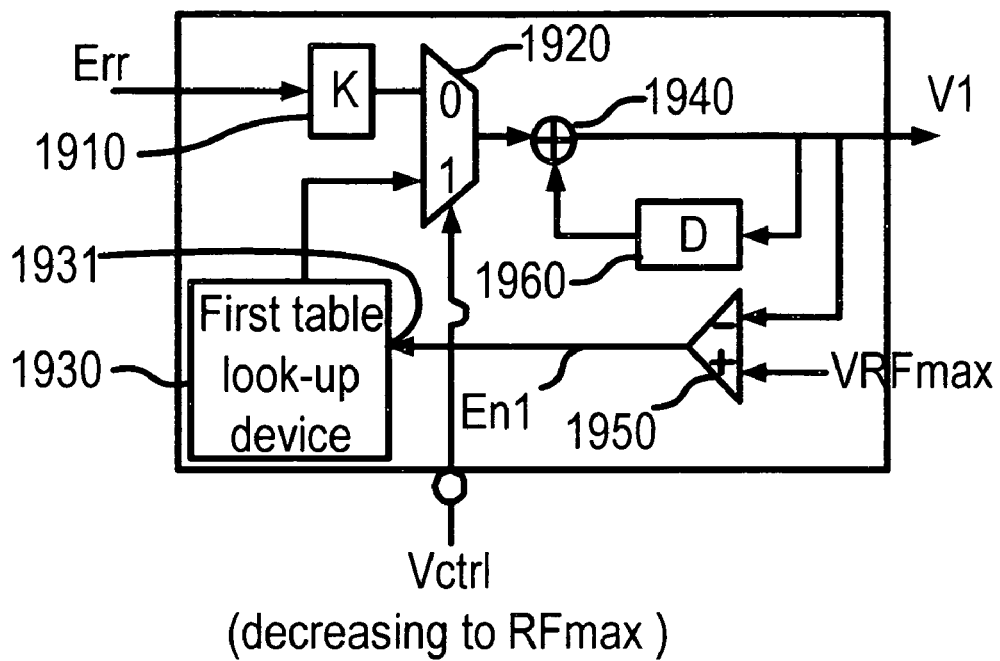
FIG. 19 is a block diagram of the first automatic gain control loop according to another embodiment of the invention.

FIG. 19 is a block diagram of the first automatic gain control loop according to another embodiment of the invention. The first automatic gain control loop 840 includes a fifth multiplier 1910, a seventh multiplexer 1920, a first table look-up device 1930, a fifth adder 1940, a third subtractor 1950, and a fifth register 1960. The first table look-up device 1930 has a first enable input 1931, when the first enable input 1931 is low potential, the first table look-up device 1930 is enabled. When the first table look-up device 1930 is enabled, it sequentially outputs a set of values, which are monotonically increasing. When the first table look-up device 1930 is not enabled, it outputs a value of 0. The set of values are all smaller than 0, such as −100Δ, −50Δ, −25Δ, and so on, where Δ is larger than 0. By the way, the first gain control signal V1 is monotonically decreasing.

Figure 20:
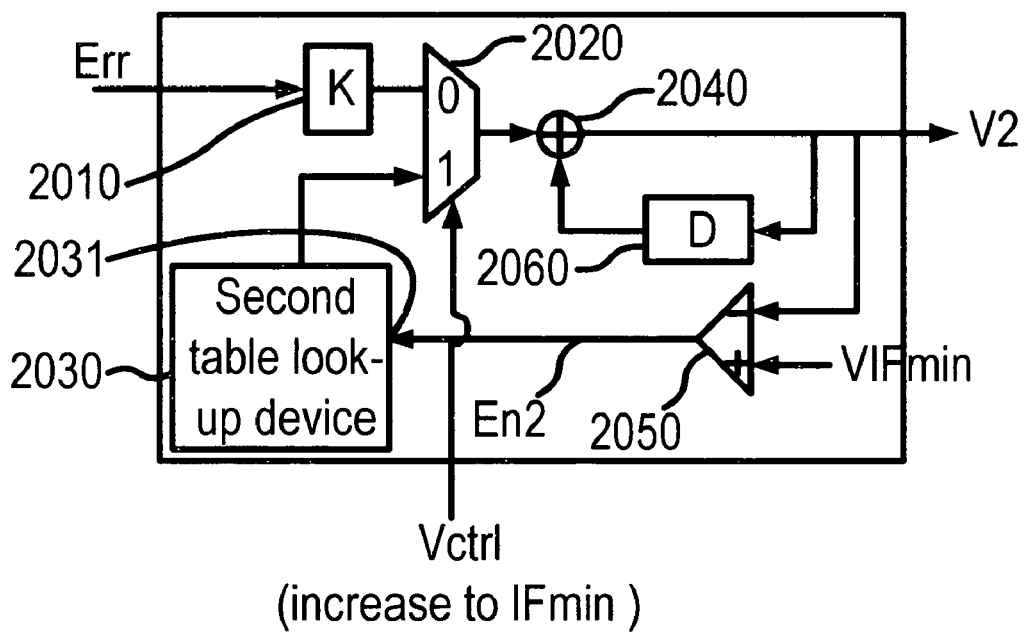
FIG. 20 is a block diagram of the second automatic gain control loop according to another embodiment of the invention.

FIG. 20 is a block diagram of the second automatic gain control loop 850 according to another embodiment of the invention. The second automatic gain control loop 850 includes a sixth multiplier 2010, an eighth multiplexer 2020, a second table look-up device 2030, a sixth adder 2040, a fourth subtractor 2050 and a sixth register 2060. The second table look-up device 2030 has a second enable input 2031. When the second enable input 2031 is high potential, the second table look-up device 2030 is enabled. When the second table look-up device 2030 is enable, it sequentially outputs a set of values, which are monotonically increasing, and the set of values are all larger than 0. When the second table look-up device 2030 is not enabled, it outputs a value of 0. The set of values are all smaller than 0, such as 100Δ, 50Δ, 25Δ, and so on, where Δ is larger than 0. By the way, the second gain control signal V2 is monotonically increasing.

When the control signal Vctrl is high potential, the first gain control signal V1 corresponds to the following equation:

$$V1(n+1)=V1(n)+\text{Err}\times K5,$$

where V1 is the first gain control signal, Err is the error signal, and K5 is the multiplicator of the fifth multiplier. The second gain control signal V2($n$+1) corresponds to the following equation:

$$V2(n+1)=V2(n)+\text{Look\_up}(VIF\text{min}-V2(n)),$$

where V2 is the second gain control signal, VIFmin is the predetermined minimum gain control voltage, and Look_up(VIFmin−V2($n$)) is the output signal generated by the second table look-up device 2030 according to the second enable input. Look_up(VIFmin−V2($n$)) can be 100Δ, 50Δ, 25Δ, and so on, where Δ is larger than 0. Namely, in the circle C of FIG. 12, since the second gain control signal V2 is smaller than the predetermined minimum gain control voltage VIFmin, the second table look-up device 2030 is enabled and sequentially outputs a set of values Look_up(VIFmin−V2($n$)), which are monotonically increasing. Since the value of Look_up(VIFmin−V2($n$)) is positive, the second gain control signal V2 gradually increases to the predetermined minimum gain control voltage VIFmin.

When the control signal Vctrl is low potential, the first gain control signal V1 corresponds to the following equation:

$$V1(n+1)=V1(n)+\text{Look\_up}(VRF\text{max}-V1(n)),$$

where V1 is the first gain control signal, VRFmax is the predetermined maximum gain control voltage, Look_up(VRFmax−V1(n)) is the output signal generated by the first table look-up device 1930 according to the first enable input, Look_up(VRFmax−V1($n$)) can be 100Δ, −50Δ, −25Δ, and so on. Namely, in the circle A of FIG. 11, since the first gain control signal V1 is larger than the predetermined maximum gain control voltage VRFmax, the first table look-up device 1930 is enabled and sequentially outputs a set of values Look_up(VRFmax−V1($n$)), which are monotonically increasing. Since the value of Look_up(VRFmax−V1($n$)) is negative, the first gain control signal V1 gradually decreases to the predetermined maximum gain control voltage VRFmax.

When the control signal Vctrl is low potential, the second gain control signal V2 corresponds to the following equation:

$$V2(n+1)=V2(n)+\text{Err}\times K6,$$

where V2 is the second gain control signal, Err is the error signal, and K6 is the multiplicator of the sixth multiplier.

From the above description, it is known that the prior art does not consider the problems of system instability and increasing noises, which are generated by the automatic gain control system frequently switching between the area I and the area II. The present invention uses the hysteresis comparator to solve the problems of system instability and increasing noises generated by frequently switching. Meanwhile, the present invention not only solves the problem generated by frequently switching, but also considers the problem of suddenly changing of gain generated by practically using the hysteresis comparator to solve the problem of error generated by the abrupt change of gain. Accordingly, the present invention provides better stability and automatic control performance to the system than in the prior art.

Although the present invention has been explained in relation to its preferred embodiment, it is to be understood that many other possible modifications and variations can be made without departing from the scope of the invention as hereinafter claimed.

What is claimed is:

1. An automatic gain control system, comprising:
    an automatic gain control path including a first variable gain amplifier and a second variable gain amplifier, the first variable gain amplifier having a predetermined maximum gain control voltage corresponding to a predetermined maximum gain of the first variable gain amplifier, the second variable gain amplifier having a predetermined minimum gain control voltage corresponding to a predetermined minimum gain of the second variable gain amplifier; and
    a control device for controlling gain of the first variable gain amplifier and gain of the second variable gain amplifier, the control device including:
        an error calculator for calculating output signal and target value of the automatic gain control path, so as to generate an error signal;
        a hysteresis comparator for comparing a first estimation signal and a take over point (TOP) value, so as to produce a control signal;
        a first automatic gain control loop connected to the hysteresis comparator and the first variable gain amplifier for generating a first gain control signal according to the control signal so as to control the gain of the first variable gain amplifier; and
        a second automatic gain control loop connected to the hysteresis comparator and the second variable gain amplifier for generating a second gain control signal according to the control signal, so as to control the gain of the second variable gain amplifier;
    wherein, when the first estimation signal leaves the hysteresis area of the hysteresis comparator, the first gain control signal and the second gain control signal are increasing or decreasing progressively.

2. The automatic gain control system as claimed in claim 1, further comprising:
    an RF strength estimation device connected to the automatic gain control path for estimating and generating the first estimation signal according to the output signal of the automatic gain control path.

3. The automatic gain control system as claimed in claim 2, wherein the first automatic gain control loop includes a third multiplier, a fifth multiplexer, a first filter, a third adder, a first subtractor, and a third register.

4. The automatic gain control system as claimed in claim 3, wherein the second automatic gain control loop includes a fourth multiplier, a sixth multiplexer, a second filter, a fourth adder, a second subtractor, and a fourth register.

5. The automatic gain control system as claimed in claim 4, wherein, when the control signal is high potential, the first gain control signal corresponds to the following equation:

$$V1(n+1)=V1(n)+\text{Err}(n)\times K3,$$

where V1 is the first gain control signal, Err is the error signal, K3 is a multiplication constant of the third multiplier.

6. The automatic gain control system as claimed in claim 5, wherein, when the control signal is high potential, the second gain control signal corresponds to the following equation:

$$V2(n+1)=V2(n)+\text{Filter2}(VIF\text{min}-V2(n)),$$

wherein, V2 is the second gain control signal, VIFmin is the predetermined minimum gain control voltage, Filter2(VIFmin−V2(n)) is the output signal of the second filter after executing filtering to the second subtractor.

7. The automatic gain control system as claimed in claim 6, wherein, when the control signal is low potential, the first gain control signal corresponds to the following equation:

$$V1(n+1)=V1(n)+\text{Filter1}(VRF\text{max}-V1(n)),$$

where V1 is the first gain control signal, VRFmax is the predetermined maximum gain control voltage, Filter1(VRFmax−V1(n)) is the output signal of the first filter after executing filtering to the first subtractor.

8. The automatic gain control system as claimed in claim 7, wherein, when the control signal is low potential, the second gain control signal corresponds to the following equation:

$$V2(n+1)=V2(n)+\text{Err}(n)\times K4,$$

where V2 is the second gain control signal, Err is the error signal, K4 is a multiplication constant of the fourth multiplier.

9. The automatic gain control system as claimed in claim 2, wherein, the first automatic gain control loop includes a fifth multiplier, a seventh multiplexer, a first table look-up device, a fifth adder, a third subtractor, and a fifth register, and wherein the first table look-up device has a first enable input, so that, when the first table look-up device is enabled, it sequentially outputs a set of values, which are monotonically increasing, and when the first table look-up device is not enabled, it outputs a value of 0.

10. The automatic gain control system as claimed in claim 9, wherein the second automatic gain control loop includes a sixth multiplier, an eighth multiplexer, a second table look-up device, a sixth adder, a fourth subtractor, and a sixth register, and wherein the second table look-up device has a second enable input, so that, when the second table look-up device is enabled, it sequentially outputs a set of values, which are monotonically increasing, and when the second table look-up device is not enabled, it outputs a value of 0.

11. The automatic gain control system as claimed in claim 10, wherein, when the control signal is high potential, the first gain control signal corresponds to the following equation:

$$V1(n+1)=V1(n)+\text{Err}(n)\times K5,$$

where V1 is the first gain control signal, Err is the error signal, K5 is a multiplication constant of the fifth multiplier.

12. The automatic gain control system as claimed in claim 11, wherein, when the control signal is high potential, the second gain control signal corresponds to the following equation:

$$V2(n+1)=V2(n)+\text{Look\_up}(VIF\text{min}-V2(n)),$$

where V2 is the second gain control signal, VIFmin is the predetermined minimum gain control voltage, Look_up(VIFmin−V2(n)) is the output signal generated by the second table look-up device according to the second enable input.

13. The automatic gain control system as claimed in claim 12, wherein, when the control signal is low potential, the first gain control signal corresponds to the following equation:

$$V1(n+1)=V1(n)+\text{Look\_up}(VRF\text{max}-V1(n)),$$

where V1 is the first gain control signal, VRFmax is the predetermined maximum gain control voltage, Look_up(VRFmax−V1(n)) is the output signal generated by the first table look-up device according to the first enable input.

14. The automatic gain control system as claimed in claim 13, wherein, when the control signal is low potential, the second gain control signal corresponds to the following equation:

$$V2(n+1)=V2(n)+\text{Err}(n)\times K6,$$

where V2 is the second gain control signal, Err is the error signal, K6 is a multiplication constant of the sixth multiplier.

15. The automatic gain control system as claimed in claim 2, wherein the first automatic gain control loop includes a first multiplier, a first multiplexer, a second multiplexer, a first adder, a first register, and a first comparator.

16. The automatic gain control system as claimed in claim 15, wherein the second automatic gain control loop includes a second multiplier, a third multiplexer, a fourth multiplexer, a second adder, a second register, and a second comparator.

17. The automatic gain control system as claimed in claim 16, wherein, when the control signal is high potential, the first gain control signal corresponds to the following equation:

$$V1(n+1)=V1(n)+\text{Err}(n)\times K1,$$

where V1 is the first gain control signal, Err is the error signal, K1 is a multiplication constant of the first multiplier.

18. The automatic gain control system as claimed in claim 17, wherein, when the control signal is high potential and the second gain control signal is smaller than the predetermined minimum gain control voltage, the second gain control signal corresponds to the following equation:

$$V2(n+1)=V2(n)+s2,$$

where V2 is the second gain control signal, s2 is the second adjustment step, and when the control signal is high potential and the second gain control signal is larger than or equals to the predetermined minimum gain control voltage, the second gain control signal corresponds to the following equation:

$$V2(n+1)=VIF\text{min},$$

where VIFmin is the predetermined minimum gain control voltage.

19. The automatic gain control system as claimed in claim 18, wherein, when the control signal is low potential and the first gain control signal is larger than the predetermined maximum gain control voltage, the first gain control signal corresponds to the following equation:

$$V1(n+1)=V1(n)+(-s1),$$

where V1 is the first gain control signal, s1 is a first adjustment step, and when the first gain control signal is smaller than or equals to the predetermined maximum gain control voltage, the first gain control signal corresponds to the following equation:

$$V1(n+1)=VRF\text{max},$$

where VRFmax is the predetermined maximum gain control voltage.

20. The automatic gain control system as claimed in claim 18, wherein, when the control signal is low potential, the second gain control signal corresponds to the following equation:

$$V2(n+1)=V2(n)+\text{Err}(n)\times K2,$$

where V2 is the second gain control signal, Err is the error signal, K2 is a multiplication constant of the second multiplier.

* * * * *